(12) United States Patent
Park et al.

(10) Patent No.: US 6,323,083 B1
(45) Date of Patent: Nov. 27, 2001

(54) METHOD FOR FORMING LOWER ELECTRODE STRUCTURE OF CAPACITOR OF SEMICONDUCTOR DEVICE

(75) Inventors: Dae-gyu Park; Sang-hyeob Lee, both of Kyunggi-do (KR)

(73) Assignee: Hyundai Electronic Industries Co., Ltd., Cheon-shi (KR)

( * ) Notice: Subject to any disclaimer, the term of this patent is extended or adjusted under 35 U.S.C. 154(b) by 0 days.

(21) Appl. No.: 09/459,652

(22) Filed: Dec. 13, 1999

(30) Foreign Application Priority Data

Dec. 30, 1998 (KR) .................................................. 98-62461

(51) Int. Cl.[7] .............................................. H01L 21/8242
(52) U.S. Cl. ......................... 438/253; 438/239; 438/240; 438/241; 438/242; 438/250; 438/251; 438/252; 438/254; 438/255; 438/256; 438/393; 438/394; 438/395; 438/396; 438/397; 438/398; 438/399
(58) Field of Search ................................... 438/239–242, 438/250–256, 393–399

(56) References Cited

U.S. PATENT DOCUMENTS

| | | |
|---|---|---|
| 5,231,306 * | 7/1993 | Meikle et al. ........................ 257/751 |
| 5,525,542 | 6/1996 | Maniar et al. . |
| 5,729,054 | 3/1998 | Summerfelt et al. . |
| 5,851,896 * | 12/1998 | Summerfelt ........................... 438/396 |
| 6,153,490 * | 11/2000 | Xing et al. ........................... 438/396 |
| 6,235,631 * | 5/2001 | Russell ................................ 438/674 |

* cited by examiner

Primary Examiner—John F. Niebling
Assistant Examiner—Jennifer M. Kennedy
(74) Attorney, Agent, or Firm—Oliff & Berridge, PLC.

(57) ABSTRACT

A method for forming a lower electrode structure of a capacitor of a semiconductor device, includes the steps of: forming an active region in a semiconductor substrate; forming an insulation layer atop the semiconductor substrate having the active region formed therein; forming a contact hole in the insulation layer, the contact hole exposing the active region; forming a conductive plug connected to the active region through the contact hole, the conductive plug having an upper contact surface; forming a silicide contact on the upper contact surface of the conductive plug; forming a lower electrode layer in electrical contact with the silicide contact, by depositing titanium aluminum nitride on the insulation layer; and patterning the lower electrode layer to form a lower electrode having an upper surface. A natural oxide film is prevented from generating between the interface of the plug and the lower electrode. The lower electrode exhibits a high resistance against oxidation, which may occur when performing a high-temperature annealing process with respect to the dielectric.

13 Claims, 2 Drawing Sheets

METHOD FOR FORMING LOWER ELECTRODE STRUCTURE OF CAPACITOR OF SEMICONDUCTOR DEVICE

BACKGROUND OF THE INVENTION

1. Field of the Invention

The present invention relates to a method for fabricating a capacitor of a semiconductor device, and more particularly, to a method for forming a lower electrode structure of a capacitor, wherein a metal such as titanium is reacted with the upper portion of a polysilicon plug connected to the substrate through an insulation layer, to form a silicide contact for electrical contact with the lower electrode.

2. Description of the Background Art

Any capacitor, such as that used for a memory cell of a semiconductor device, basically includes a pair of electrodes separated by a dielectric layer. In a semiconductor device comprising a gate, source, and drain, the lower electrode is connected to an active region of the device through a contact hole.

In the development of memory devices having increased memory capacity, an increased cell capacitance must be secured for ever-diminishing areas. In order to obtain increased cell capacitance within a given area, one of three conditions should be satisfied: the dielectric layer should have an increased dielectric constant, either by way of dielectric material selection or by subsequent processing of the dielectric layer, e.g., by a thermal treatment process; the effective area between the plates (electrodes) should increased in some manner, for example, by utilizing a three-dimensional dimensional electrode structure; or the capacitor should be fabricated such that the distance between the plates is decreased, meaning that the dielectric layer is made thinner. There is a practical limit to decreasing the thickness of the dielectric layer, and three-dimensional structures are highly complex formations, which have their own limitations.

As one example of the aforementioned thermal treatment process to improve the dielectric layer, an oxide annealing process may be performed at a high temperature of approximately 700° C. to enhance properties of the dielectric layer. Such a process, however, also produces an undesirable oxidation effect, i.e., a natural oxide film grows on the electrode surfaces, which causes a reduction in the resultant capacitance. The oxidation of conductive surfaces occurs due to oxide gases reaching the lower electrode by seeping under the dielectric layer, in particular, at the edges thereof.

Meanwhile, in coping with the tendency for the contact hole to have a higher aspect ratio due to decreased areas (hole size) in more highly integrated semiconductor devices, in many cases, the capacitor needs to be provided with a conductive plug for connecting the active region and the lower electrode. The plug is formed by filling the contact hole, which is formed in a relatively thick insulation layer, with a doped polysilicon, thus establishing an interface for electrical connection between the upper surface of the plug and the lower surface of the lower electrode.

However, in such a capacitor, i.e., one having such a plug, the plug interface may become oxidized during the above thermal treatment process, which degrades the adhesive force between the lower electrode and the plug, especially in the event of imperfect alignment conditions between the polysilicon plug and the lower electrode. This degraded adhesion causes a lifting phenomenon, whereby the plug may become separated from the lower electrode during subsequent processing. Such separation reduces the overall capacitance and degrades the electrical characteristics of the capacitor, such as leakage current and reliability, while decreasing the yield rate of a semiconductor device having such a capacitor.

SUMMARY OF THE INVENTION

Therefore, an object of the present invention is to provide a method for forming an improved lower electrode structure of a capacitor of a semiconductor device, which overcomes the problems of the conventional art.

It is another object of the present invention to provide a method for forming a lower electrode structure of a capacitor of a semiconductor device, which improves the electrical connection between a conductive plug and the lower electrode.

It is yet another object of the present invention to provide a method for forming a lower electrode structure of a capacitor of a semiconductor device, which inhibits the formation of a natural oxide film at the interface of a conductive plug and the lower electrode, even when a high-temperature oxidizing process is performed with respect to the dielectric layer.

It is still another object of the present invention to provide a method for forming a lower electrode structure of a capacitor of a semiconductor device, which improves the electrical characteristics of the capacitor.

It is a further object of the present invention to provide a method for forming a lower electrode structure of a capacitor of a semiconductor device, which increases the yield rate of the semiconductor device.

It is still a further object of the present invention to provide a method for forming a lower electrode structure of a capacitor of a semiconductor device, in which the reliability of the capacitor is improved.

It is still yet another object of the present invention to provide a method for forming a lower electrode structure of a capacitor of a semiconductor device, in which the leakage current of the capacitor is reduced.

To achieve these and other advantages and in accordance with the purposed of the present invention, as embodied and broadly described herein, there is provided a method for forming a lower electrode structure of a capacitor of a semiconductor device, comprising the steps of: forming an active region in a semiconductor substrate; forming an insulation layer atop the semiconductor substrate having the active region formed therein; forming a contact hole in the insulation layer, the contact hole exposing the active region; forming a conductive plug connected to the active region through the contact hole, the conductive plug having an upper contact surface; forming a silicide contact on the upper contact surface of the conductive plug; forming a lower to electrode layer in electrical contact with the silicide contact, by depositing titanium aluminum nitride on the insulation layer; and patterning the lower electrode layer to form a lower electrode having an upper surface.

According to the above method, the silicide layer is formed on the upper portion of the plug, and the lower electrode made of a titanium aluminum nitride having a high oxidation inhibiting characteristic is formed atop the insulation layer to be connected to the silicide layer. This oxidation is inhibited at the upper portion and the lower portion of the lower electrode, even though a high-temperature oxidizing process is performed to improve properties of the dielectric layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention, in which.

DETAILED DESCRIPTION OF THE PREFERRED EMBODIMENTS

Figure 1:
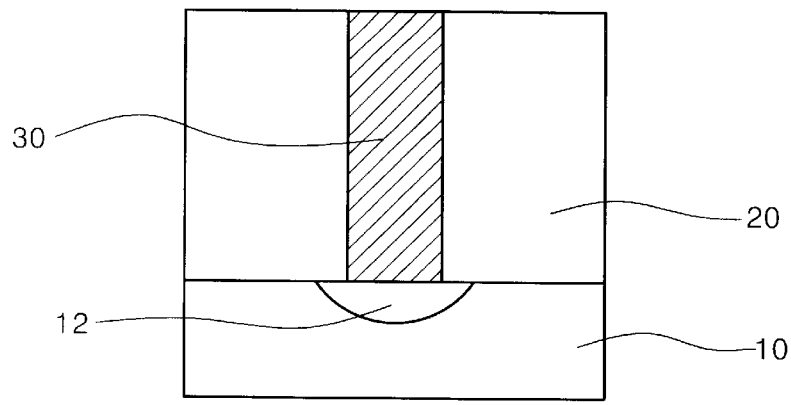
FIG. 1 is a sectional view illustrating a process step of a method for forming a lower electrode structure of a capacitor of a semiconductor device, in accordance with the present invention, showing a polysilicon plug filling a contact hole formed in an insulation layer.

As shown in FIG. 1, an active region 12 of a semiconductor device (not shown) is formed in a silicon substrate 10. An insulation layer 20 made of undoped silicate glass, borophosphosilicate glass, or nitric oxide silicate (SiON) is formed on the entire surface of the silicon substrate 10 and is then planarized using, for example, a chemical mechanical polishing process. Thereafter, a contact hole for exposing the active region 12 is formed by selectively etching the insulation layer 20 using a photolithography process. Then, a polysilicon doped with an N-type impurity such as $PH_3$, $AsH_3$, or Sb or with a P-type impurity such as $B_2H_6$ or $AlCl_3$ is deposited on the resultant structure, to sufficiently fill the contact hole formed in the insulation layer 20, and the chemical mechanical polishing is performed thereon, as necessary, thereby forming a conductive plug 30 filling the contact hole.

Figure 2:
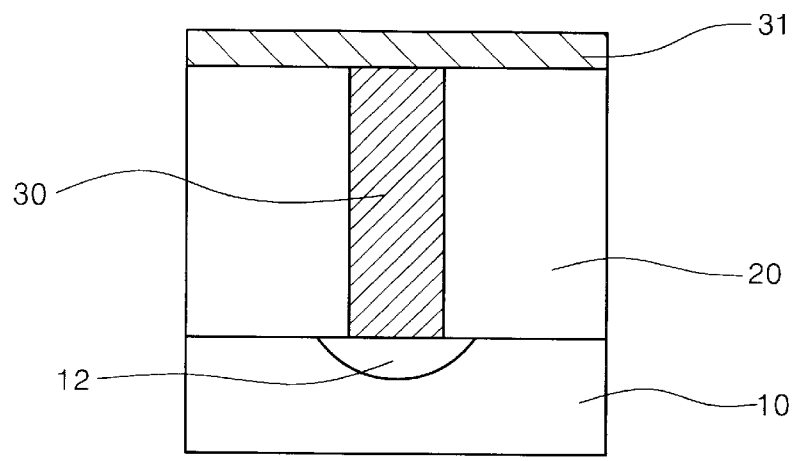
FIG. 2 is a sectional view illustrating a process step of a method for forming a lower electrode structure of a capacitor of a semiconductor device, in accordance with the present invention, showing a metal layer formed over the polysilicon plug before a thermal process is performed to react the metal with the polysilicon.

As shown in FIG. 2, titanium, cobalt, tantalum, nickel, or platinum is deposited atop the insulation layer 20 where the conductive plug 30 is formed. In the embodiment of the present invention, a titanium layer 31 is formed to a thickness of 50~500 Å by sputtering or by a chemical vapor deposition method. A thermal process is subsequently performed to react the metal material with the polysilicon of the conductive plug 30. The non-reacted metal material is later removed by surface etching.

Figure 3:
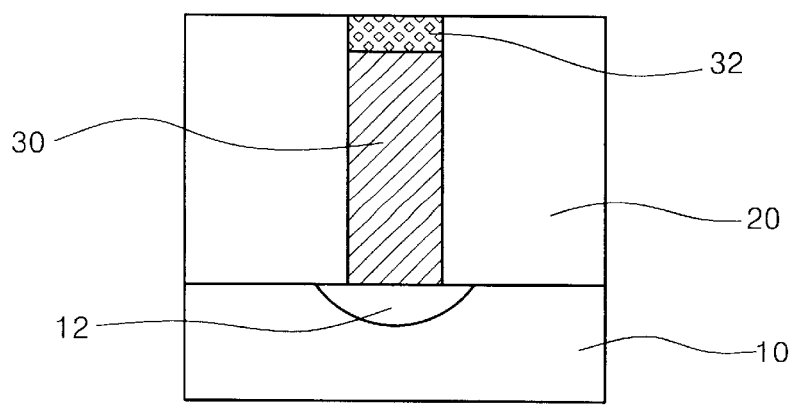
FIG. 3 is a sectional view illustrating a process step of a method for forming a lower electrode structure of a capacitor of a semiconductor device, in accordance with the present invention, showing a silicide contact formed in the polysilicon plug after the thermal process is performed and the non-reacted metal is removed.

As shown in FIG. 3 showing the result of the thermal process, a silicide layer ($TiSi_x$) 32 is created, which prevents the growth of a natural oxide film thereon. As for the thermal process employed, a rapid thermal annealing or a furnace annealing of which the temperature condition is 550~750° C., with a gas such as nitrogen, argon, helium, or xenon being used alone or in a mixed state with one or more of the other gases. As described above, after the thermal process, surface etching is performed to remove only the non-reacted titanium, leaving the silicide layer 32 in the upper portion of the contact hole and a planarized lower structure for forming the lower electrode thereon. The etchant employed is $H_2O_2:NH_4OH$:deionized water at a ratio of 1:1:3~10.

Figure 4:
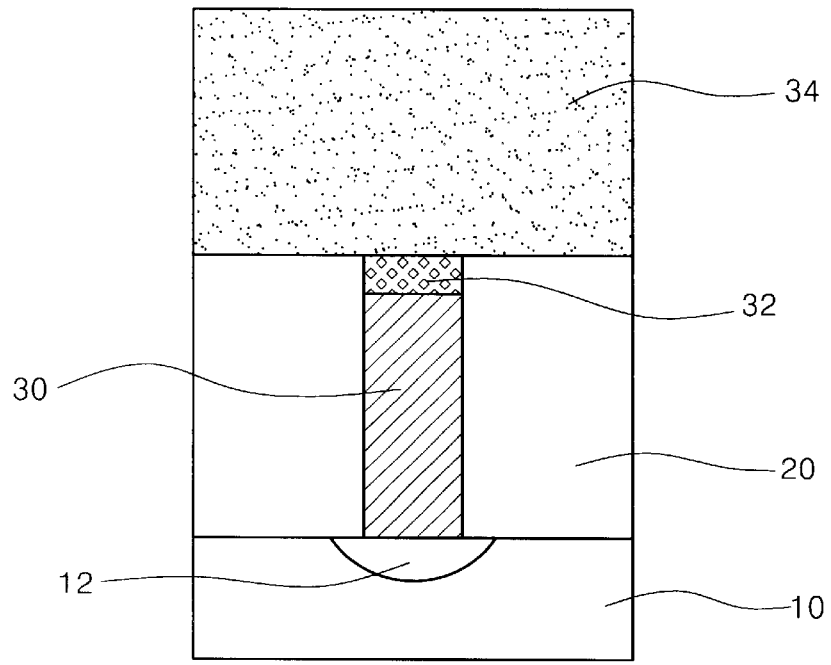
FIG. 4 is a sectional view illustrating a process step of a method for forming a lower electrode structure of a capacitor of a semiconductor device, in accordance with the present invention, showing a layer of oxidation-resistant material for forming the lower electrode.

As shown in FIG. 4, as a material exhibiting high resistance is against oxidation at high temperatures, a layer 34 of titanium aluminum nitride (TiAlN) is formed atop the planarized lower structure obtained in the step described with respect to FIG. 3, to a thickness of 3,000~15,000 Å, by a reactive sputtering method using a titanium aluminate ($TiAl_x$) target and nitrogen gas.

Figure 5:
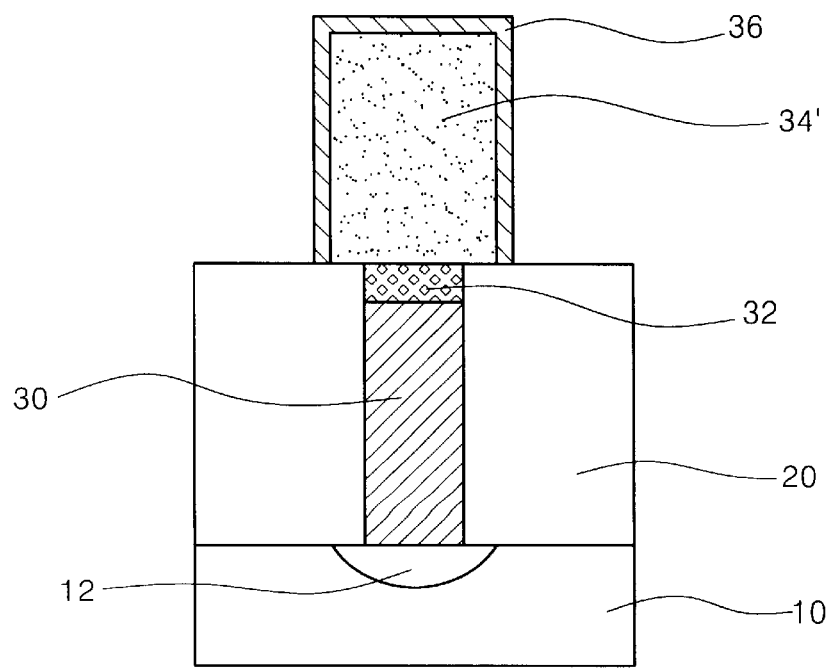
FIG. 5 is a sectional view illustrating a process step of a method for forming a lower electrode structure of a capacitor of a semiconductor device, in accordance with the present invention, showing a patterned and nitride-processed lower electrode.

As shown in FIG. 5, the TiAlN layer 34 is patterned using a photolithography and etching process, to form a lower electrode 34'. To improve the resistive contact of the interface of the lower electrode 34', i.e., guard against oxidation, and to enhance the electrode's electrical characteristics, a nitriding process is performed which forms a nitride thin film 36 on the exposed upper surfaces of the lower electrode 34'.

As the nitriding process, a rapid thermal nitridation process or a nitride plasma process may be used. In the case of rapid thermal nitridation, the temperature condition is 650~850° C. and $N_2$ or $NH_3$ gas is used, while the nitride plasma processing uses $N_2$ or $NH_3$ gas and is performed at a high-frequency voltage and 500~1500W of power. By performing the nitriding process, the grain boundary of the TiAlN material of the lower electrode 34' is filled with nitrogen, which increases the material's resistance against oxidation.

Thereafter, though the nitride thin film 36 on the lower electrode 34' may be partially oxidized when the dielectric layer undergoes the thermal treatment (oxide annealing) to enhance properties of the dielectric layer, since the lower electrode 34' has been nitride-processed as described above, the ensuing oxide film formed on the nitride thin film 36 is a thin and uniform layer of aluminum oxide ($Al_2O_3$) or titanium oxide ($TiO_2$), which has a high dielectric constant. Thus, the quality of the capacitor is not deteriorated even though the nitride thin film 36 may be oxidized undesirably. Particularly, should $Ti_{1-x}Al_xN$ be used as the material of the lower electrode 34', with the x value in the range of 0.15~0.35, the obtained lower electrode structure is resistant to high-temperature oxidation at temperatures 200° C. higher than when the material is titanium nitride (TiN), so that oxidation of the lower electrode is greatly retarded such that the capacitor's electrical characteristics are not degraded by the annealing process.

As described above, according to the method of the present invention, the silicide layer formed between the lower electrode and the conductive plug prevents the growth of a natural oxide film generated in the interface thereof by the annealing process for forming the dielectric layer, or during any other thermal oxidation process which may affect the lower electrode layer, resulting in an improved electrical connection between the lower electrode and the plug.

In addition, the nitriding process performed on the TiAlN material of the lower electrode reduces the work function of the metal of the lower electrode and the dielectric. In particular, the obtained work function is lower than that for a polysilicon lower electrode and the dielectric.

According to the present invention, oxidation of the lower electrode is inhibited, to thereby improve various properties of the capacitor of a semiconductor device, including reduced leakage current, while improving the reliability and the capacitor and the yield rate of the semiconductor device.

Since the present invention may be embodied in various forms, without departing from the essential characteristics thereof, it should be understood that the above-described embodiment is not to be limited by any of the details of the foregoing description, unless otherwise specified, but should be construed only as defined in the appended claims. Thus, all modifications that fall within the scope of the claims are therefore intended to be embraced thereby.

What is claimed is:

1. A method for forming a lower electrode structure of a capacitor of a semiconductor device, comprising the steps of:

forming an active region in a semiconductor substrate;

forming an insulation layer atop the semiconductor substrate having the active region formed therein;

forming a contact hole in the insulation layer, the contact hole exposing the active region; forming a conductive plug connected to the active region through the contact hole, the conductive plug having an upper contact surface;

forming a silicide contact on tile upper contact surface of the conductive plug;

forming a lower electrode layer in electrical contact with the silicide contact, by depositing titanium aluminum nitride on the insulation layer; and patterning the lower electrode layer to form a lower electrode having an upper surface and wherein a nitriding process is performed on the lower electrode to form a nitride thin film on the upper surface of the lower electrode.

2. The method as claimed in claim 1, wherein a nitriding process is performed on the lower electrode to form a nitride thin film on the upper surface of the lower electrode.

3. The method as claimed in claim 1, wherein the lower electrode layer is 3,000~15,000 Å in thickness.

4. The method as claimed in claim 1, wherein the titanium aluminum nitride exhibits a high resistance against oxidation at high temperature.

5. The method as claimed in claim 4, wherein the titanium aluminum nitride satisfies $Ti_{1-x}Al_xN$, with the x value in the range of 0.15~0.35.

6. The method as claimed in claim 1, wherein the conductive plug is made of a metal.

7. The method as claimed in claim 1, wherein the conductive plug is made of a polysilicon doped with an impurity.

8. The method as claimed in claim 7, wherein the silicide contact is formed by the steps of:

depositing one metal selected from the group consisting of titanium, cobalt, tantalum, nickel, and platinum on the upper contact surface of the conductive plug;

perfoming a themal process on the deposited metal, to react the deposited metal with the polysilicon of the conductive plug; and removing non-reacted portion of the deposited metal by a surface etching technique.

9. The method as claimed in claim 8, wherein the surface etching technique employs an etchant of $H_2O_2:NH_4OH$:deionized water at a ratio of 1:1:3~10.

10. The method as claimed in claim 8, wherein the thermal process is a rapid thermal annealing of which the temperature condition is 550~750° C., using a gas selected from the group consisting of nitrogen, argon, helium, xenon, and a mixture thereof.

11. The method as claimed in claim 8, wherein the thermal process is a furnace annealing of which the temperature condition is 550~750° C., using a gas selected from the group consisting of nitrogen, argon, helium, xenon, and a mixture thereof.

12. The method as claimed in claim 1, wherein the nitriding process is a rapid thermal nitriding process performed at a temperature of 650~850° C., using one gas selected from the group consisting of $N_2$ and $NH_3$.

13. The method as claimed in claim 1, wherein the nitriding process is a nitride plasma process performed at a high-frequency voltage and 500~1500W of power, using one gas selected from the group consisting of $N_2$ and $NH_3$.

* * * * *